United States Patent [19]
Chapman

[11] Patent Number: 5,384,266
[45] Date of Patent: Jan. 24, 1995

[54] ELECTRONIC DEVICE MANUFACTURE USING ION IMPLANTATION

[75] Inventor: Jeffrey A. Chapman, Burgess Hill, England

[73] Assignee: U.S. Philips Corporation, New York, N.Y.

[21] Appl. No.: 160,990

[22] Filed: Dec. 3, 1993

[30] Foreign Application Priority Data

Dec. 11, 1992 [GB] United Kingdom ............. 9225906

[51] Int. Cl.⁶ .................................... H01L 21/266
[52] U.S. Cl. ............................. 437/21; 437/40; 437/51
[58] Field of Search ............... 437/20, 21, 40, 51; 148/DIG. 45, DIG. 84

[56] References Cited

U.S. PATENT DOCUMENTS

| | | | |
|---|---|---|---|
| 5,210,045 | 5/1993 | Possin et al. | 437/51 |
| 5,286,659 | 2/1994 | Mitani et al. | 437/40 |
| 5,290,709 | 3/1994 | Sato | 437/20 |
| 5,300,448 | 4/1994 | Merchant et al. | 437/21 |

FOREIGN PATENT DOCUMENTS 60-251665 12/1985 Japan .

Primary Examiner—Brian E. Hearn
Assistant Examiner—Chandra Chaudhari
Attorney, Agent, or Firm—John C. Fox

[57] ABSTRACT

In the manufacture of liquid crystal display devices with drive circuits and of other large area electronics devices, discharge damage of tracks (9) and other parts of a thin-film pattern (12) can result during an ion-implantation step for forming transistors (15) and doping the tracks (9). This damage is avoided by providing a discharge path (10) which is so constructed in accordance with the invention that no extra processing steps are required, and the path (10) can be retained in the manufactured device. This discharge path has along its length a series of discharge gaps (20) which separate successive thin-film regions (10, 9) of the path and so provide electrical isolation for normal operation of the device. However, during the ion implantation, charge leakage occurs across the discharge gaps (20) between the separate successive regions (10, 9) of the path so providing a continuous and controlled discharge from the pattern (12).

14 Claims, 3 Drawing Sheets

ELECTRONIC DEVICE MANUFACTURE USING ION IMPLANTATION

BACKGROUND OF THE INVENTION

This invention relates to methods of manufacturing an electronic device (for example a liquid crystal display with an integrated drive circuit) having thin-film circuit elements and tracks on an insulating substrate, and relates particularly to the provision of means for protecting against problems due to charging of the thin-film tracks during an ion implantation step in the manufacture of the device. The invention also relates to the electronic devices as manufactured by such a method.

Nowadays thin-film circuit technologies are being used for manufacture of liquid crystal display (LCD) devices and many other large area electronic devices, for example ROMs (read only memories) and other data stores, and various image sensors. Such devices have an insulating substrate (for example of an inexpensive glass or plastics material) on which a pattern of thin-film circuit elements are formed by steps which include depositing films of various materials (for example insulators, semiconductors, semi-insulators, metals) on the substrate and etching the films into a desired pattern. Conductive tracks and various active circuit elements, for example thin-film polycrystalline silicon transistors, may be formed in this way. Some manufacturing methods also involve one or more steps of implanting ions in areas of at least one of the films to modify the conductivity properties of the film, for example to dope a source or drain or gate region of such a transistor. In the LCD or other devices mentioned above, the circuit elements may be arranged to form, for example, a matrix of switching elements and one or more drive circuits for driving the matrix.

Such a method is known from published Japanese patent application Kokai JP-A-60-251665, as disclosed in the English language Patents Abstracts of Japan published by the Japanese Patent Office and in the drawings of JP-A-60-251665, the whole contents of which are hereby incorporated herein as reference material. A group of thin-film parallel tracks forms part of the pattern of circuit elements, and these are provided on the substrate before an ion implantation step. Also provided as a part of the thin-film pattern on the substrate before the implantation step is a discharge path which extends from within the group of tracks, outwards towards a periphery of the substrate. The discharge path serves to mitigate charging of the tracks during the ion implantation, and the particular problem mentioned in JP-A-60-251665 is to prevent dielectric breakdown of the gate insulating film of the thin-film transistors.

JP-A-60-251665 discloses forming the discharge path and the group of tracks as a single continuous conductor pattern from the same thin film, which interconnects and so short-circuits the tracks. These tracks provide the gate lines for transistors of the device. After the ion implantation step the gate lines are isolated from each other by etching away areas of these interconnections which form the discharge path. The areas to be etched away are defined by a mask which needs to be aligned with respect to the spaces between the parallel gate tracks. This subsequent mask-alignment requirement necessitates the location of the discharge path of JP-A-60-251665 at an area where there is a comparatively wide spacing between the neighbouring tracks, if the gate tracks themselves are not to be etched into at their edges, and if the yield of good devices from a manufacturing process is not to be reduced.

The present applicant finds that it is sometimes desirable to provide a discharge path at a location where tracks are more closely spaced and where the spacing is insufficient to permit a subsequent mask-alignment and etching step to be carried out without causing a significant reduction in yield. The present applicant also finds that, with large area substrates (for example about 100 $cm^2$ and more) and due to the insulating nature of an underlying film and/or of the substrate itself, the charging problem during ion implantation may be such that, instead of or as well as dielectric breakdown in an active circuit element (for example, the gate insulator of a thin-film transistor), parts of the thin-film pattern (and in particular parallel tracks over part of their length) are blown away by the resulting severe discharges. Such discharges and the resulting track damage can be particularly severe in the vicinity of large exposed areas of the insulating film and/or substrate. For this reason, the present applicant finds that it is desirable in the manufacture of many devices to provide implantation discharge paths at other locations than adjacent to the active circuit elements, and for example to provide such discharge paths from various locations along the length of closely spaced parallel tracks.

OBJECTS AND SUMMARY OF THE INVENTION

It is an object of the present invention to provide another arrangement for forming the discharge path for the implantation step, which other arrangement may be used with more closely spaced tracks and/or at different locations along the length of the tracks, and which does not require any extra processing step, for example a subsequent etching step to isolate these tracks after the implantation.

According to the present invention, there is provided a method of manufacturing an electronic device having an insulating substrate on which thin-film circuit elements are formed by steps which include depositing films of various materials on the substrate, etching the films into a desired pattern, and implanting ions in areas of at least one of the films, wherein before the implantation step there is provided on the substrate a thin-film pattern which comprises a group of tracks and a discharge path, which discharge path extends from within the group outwards towards a periphery of the substrate and serves to mitigate charging of the tracks during the ion implantation, which method is characterised in that the thin-film pattern provides along the length of the discharge path a series of discharge gaps which separate successive thin-film regions of the path and across which, during the ion implantation step, charge leakage occurs between the separate successive regions of the path, the tracks of the group being separated by respective discharge gaps from adjacent regions of the path.

Due to the separating effect of the discharge gaps, the tracks are isolated from each other and from the adjacent thin-film regions of the path during normal operation of the device. Therefore there is no need to carry out any extra processing steps to achieve this isolation. In particular, there is no need to etch away the extra thin-film regions of the path after the implantation step, and these extra regions will normally be retained in the manufactured device. Even though a certain amount of space is required between the tracks for the accommodation of the extra thin-film regions and their discharge gaps, that space can be less than is required for the mask alignment and etching steps for the removal of interconnections. The inclusion of the discharge gaps permits the minimum spacing of the layout design rules to be used without significantly risking the yield of the manufactured device, as will be explained hereinafter with reference to the embodiments shown in the drawings.

With some patterns of circuit elements and tracks (for example in particular areas of the device) the discharge path may be a series of the extra regions extending between and parallel to the tracks of the group. In an alternative, particularly advantageous form, the discharge path comprises a series of thin-film regions which extends in a direction transverse to the longitudinal direction of the tracks, and the individual regions of the series are interleaved with the parallel tracks of the group. Such a transverse path can direct charge away from the active circuit elements and may extend to the periphery of the substrate.

Such implantation discharge paths formed in accordance with the present invention may be incorporated at a variety of different locations to protect a variety of different thin-film patterns during implantation. More than one such discharge path may be provided across long lengths of thin-film tracks. Thus, a first series and a second series of the extra regions may provide respective first and second discharge paths at different locations along the longitudinal direction of the tracks, the regions of the first series being separated from the regions of the second series by a space which is longer than the discharge gap. Since the space between the first and second series is larger than the discharge gap, discharge still preferentially occurs transverse to the longitudinal direction of the tracks, rather than along the tracks to active circuit elements. Such an arrangement of multiple discharge paths may even be accommodated in a compact pattern geometry where, after the ion implantation step, a further thin-film track which extends transverse to the group of tracks wil be provided in the space between the first and second series.

The series of extra thin-film regions extends outwards from within the group of parallel tracks. Where the pattern of circuit elements so permits, an outermost thin-film region or regions of the discharge path preferably extends to a peripheral area of the substrate, and it may be connected here to a discharge potential (for example an earthing point in the ion implantation machine) during the ion implantation step. However, sometimes the group of tracks protected by the discharge path is so surrounded by other circuit elements of the pattern that there is no available space for the discharge path to extend to the periphery; in this case, the discharge path may be shaped away from critical areas of the device and may instead extend to an area of the thin-film pattern which will not be damaged or which will not be affected by damage resulting from the charge build-up.

The implantation discharge path is designed to protect against charge build up within the thin-film pattern during ion implantation, by transferring that charge outwards towards the periphery; and the width of the discharge gaps is chosen in accordance with the magnitude of charging during the implantation. Although the expression "discharge gap" is used in connection with this invention, it should be understood that the width of the gap is not so large that charge transport across the gap can only be achieved by intermittent and uncontrolled abrupt discharges after a massive charge build-up has occurred on the separated regions. Instead the gap is sufficiently small that charge leakage occurs between the separated regions, and so the discharge is continuous and controlled and no massive charge build-up occurs. Therefore the gaps could be termed "leakage gaps" instead of "discharge gaps", and the path could be termed a "leakage path" instead of a "discharge path". When the extra thin-film regions of the discharge path extend to the periphery of the substrate and are retained there in the manufactured device, these outer regions (and the outer discharge gaps) in the peripheral area may be designed to protect the device against electrostatic discharge damage arising from handling of the substrate. This situation differs from that of ion implantation, in that the electrostatic charge resulting from handling is generated in the peripheral areas (and so there is a need to prevent it from flowing inwards into the thin-film pattern), and the static charge normally generated is of a smaller magnitude than that generated over the whole substrate area by the ion implantation. In a device having an implantation discharge path in accordance with the present invention, electrostatic protection may be obtained by forming an outer or the outermost region(s) of the path(s) as a continuous conductive grid around a peripheral area of the substrate, and the width of the discharge gap(s) between this grid and the inner parts of the discharge path(s) may be enlarged (if they are not already sufficiently large for this other purpose) to prevent the flow of the static charge from the peripheral area inwards into the active areas of the device pattern.

High speed drive circuits for matrix devices can be formed with ion-implanted polycrystalline silicon thin-film transistors, but the effect of implantation discharge damage on such drive circuits is that a whole line of the matrix may become inoperative. An implantation discharge path formed by thin-film regions with discharge gaps in accordance with the present invention is particularly suitable for incorporation within such drive circuits and/or between such drive circuits and the matrix. Thus, in a device manufactured in accordance with the invention the pattern of thin-film circuit elements formed on the substrate may comprise both a matrix of switching elements and a drive circuit for driving parallel lines of the matrix; the group of thin-film parallel tracks may form part of the drive circuit for the parallel lines, and the discharge path may extend in a direction away from the circuit elements of the matrix and the circuit elements of the drive circuit.

BRIEF DESCRIPTION OF THE DRAWING

These and other features in accordance with the present invention are illustrated specifically in embodiments of the invention now to be described, by way of example, with reference to the accompanying diagrammatic drawings, in which.

Figure 1:
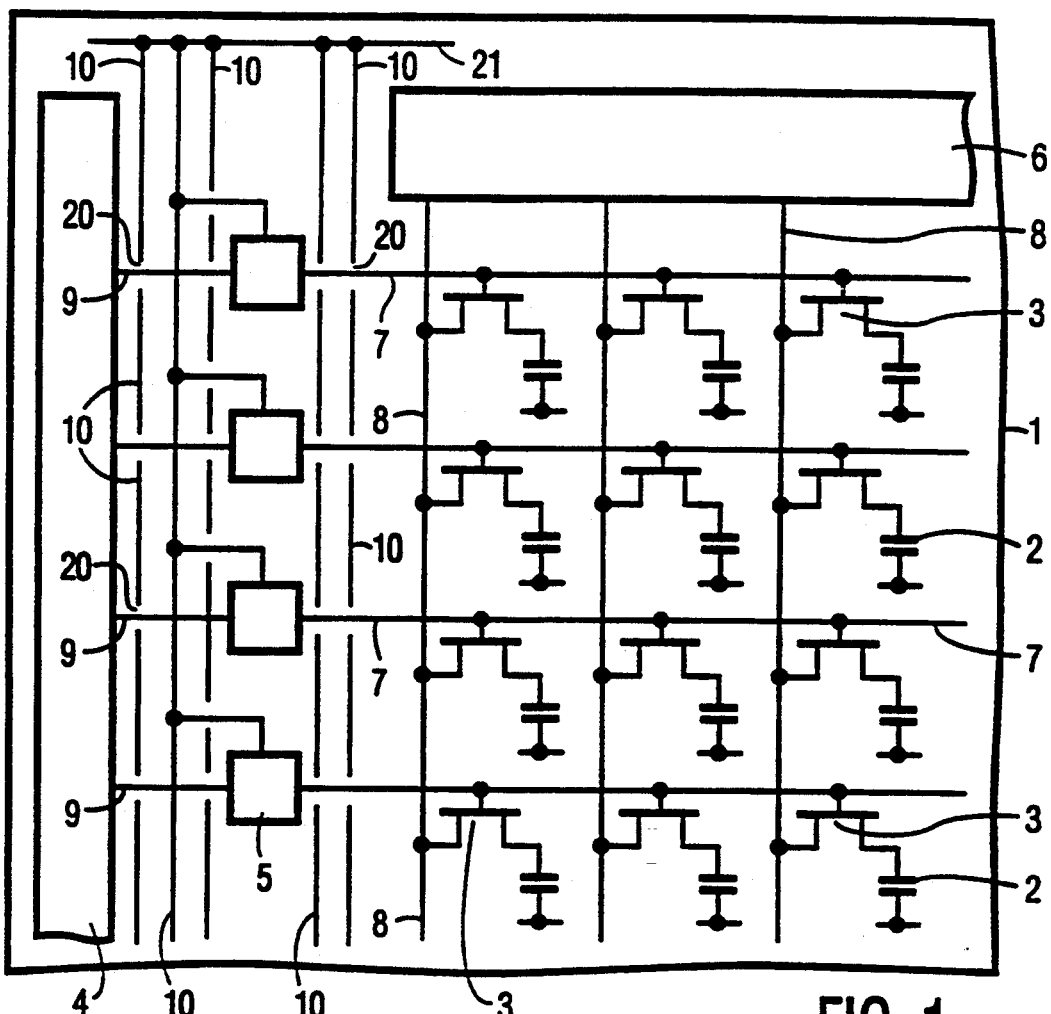
FIG. 1 is a largely schematic plan view of an electronic device manufactured in accordance with the present invention and including implantation discharge paths in accordance with the present invention.

It should be noted that all the drawings are diagrammatic and not drawn to scale. Relative dimensions and proportions of parts of the Figures have been shown exaggerated or reduced in size for the sake of clarity and convenience in the drawings.

DESCRIPTION OF THE PREFERRED EMBODIMENTS

The present invention may be used in the manufacture of a wide variety of large-area electronics devices comprising thin-film circuit elements formed on an insulating substrate 1. A device such as that illustrated in FIG. 1 may be, for example, an active matrix liquid crystal display having a matrix of individual picture elements 2 between opposed electrodes respectively located on the substrate 1 and on a front plate (not shown) of the display. Thus, the substrate 1 may be of an inexpensive glass providing a backplane of the display and carrying a matrix of pixel switching elements 3 (for example thin-film transistors) and associated drive circuitry 4,5,6 (also formed of, for example, thin-film transistors 15).

The matrix of elements 2,3 and drive circuitry 4,5,6 may be organised, arranged and connected together in known manner. Thus, the individual picture elements 2 may be addressed in known manner using scanning signals applied sequentially to row conductors 7 of the matrix from a drive circuit 4, 5 comprising an output driver stage 5 of a shift register stage 4; and video data signals are applied in synchronism to column conductors 8 of the matrix to modulate light transmission through the picture elements 2 in accordance with video information. The column drive circuitry 6 may comprise, for example, a shift register addressing individual sample and hold circuits for each column conductor 8.

However, instead of being an active matrix flat panel display, the device arrangement of FIG. 1 may be designed for quite a different function, for example a data store comprising on a substrate 1 a matrix of switching elements 3 which address individual storage elements 2 (for example thin-film capacitors) and which are driven by associated circuitry 4,5,6. In another form, the electronic device may be an image sensor having a switching matrix 3 which serves for addressing an array of thin-film image sensing elements (for example photodiodes) and which is driven by the associated circuitry 4,5,6 also formed in thin-film technology on a substrate 1.

The pattern of thin-film circuit elements forming the matrix 2,3 and drive circuitry 4,5,6 comprise several groups of thin-film parallel tracks, of which three examples are schematically illustrated in FIG. 1, i.e. the group of column conductors 8, the group of row conductors 7 and a group of row drive conductors 9. FIG. 1 also illustrates schematically the inclusion of implantation discharge paths 10 formed in accordance with the invention and extending outwards to the periphery of the substrate 1, from within the groups of tracks 7 and 9; these discharge paths 10 shown in FIG. 1 extend in a direction transverse to the longitudinal direction of the respective tracks 7 and 9. The paths 10 serve to mitigate charging of the tracks 7 and 9 during an ion implantation stage in the manufacture of the device.

Figure 2:
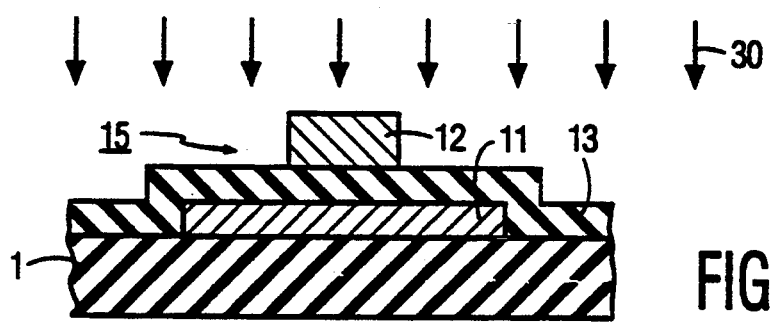
FIG. 2 is a cross-sectional view of part of a thin-film transistor of the device of FIG. 1, at an ion implantation stage in the manufacture of the device.
Figure 3:
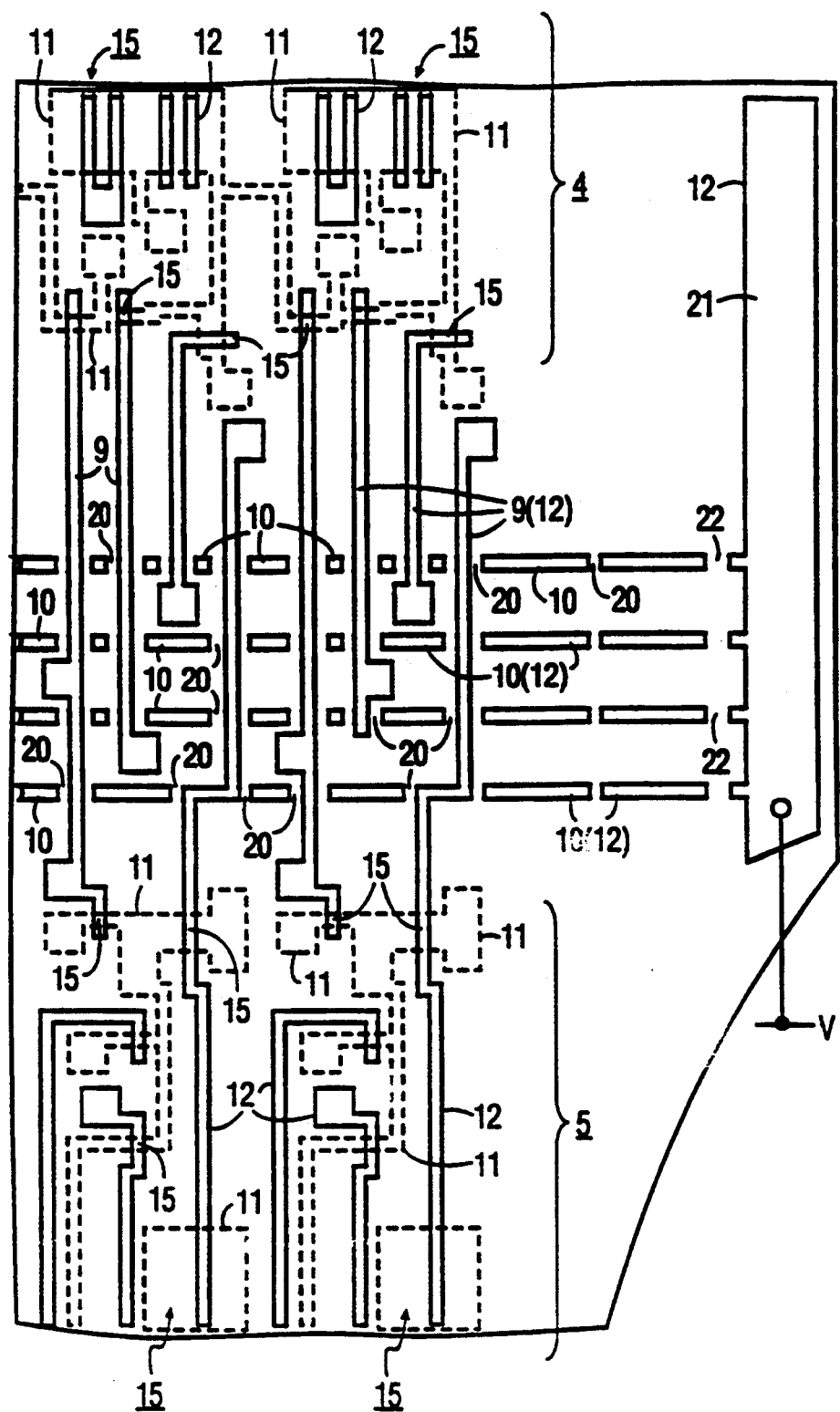
FIG. 3 is a plan view of part of a thin-film circuit pattern (including the thin-film transistor of FIG. 2) at the ion implantation stage of FIG. 2 and including implantation discharge paths in accordance with the present invention.

Thus, the pattern of thin-film circuit elements are formed by known process steps which include depositing films of various materials on the substrate 1, etching the films into a desired pattern, and implanting ions in areas of at least one of the films. FIG. 2 illustrates such an ion implantation step in the formation of a thin-film transistor 15. This implantation step is preceded by the steps of depositing on the substrate 1 a silicon film 11 which is etched to form the body of each transistor and possibly also some interconnection tracks between the transistors, depositing and etching an insulating layer 13 of, for example, silicon dioxide to form a gate insulator of the transistors 15, and depositing and etching a silicon film 12 to form a gate electrode of the transistors 15 and also some of the interconnection tracks (e.g. tracks 7 and 9) in the circuit pattern. FIG. 3 illustrates the patterns of the films 11 and 12 during the implantation step of FIG. 2. The pattern of the film 11 is illustrated in broken outline in FIG. 3 so that it can be clearly distinguished from the solid outline of the film 12.

The implantation step involves directing a beam of high energy ions 30 of a suitable dopant (for example, phosphorus) at the substrate 1 to penetrate into and dope the silicon film pattern 12 (which includes the transistor gates and the tracks 7 and 9) and the unmasked regions of the silicon film pattern 11 (for example to form source and drain regions in the transistor body parts where not masked by the gate film 12). This implantation doping of the films 11 and 12 increases the conductivity of the implanted regions. The presence of the discharge paths 10 extending outwards from within the groups of tracks 7 and 9 prevents excessive charge build up on the patterns 11 and 12 during this implantation of the ions. This charge on the patterns 11 and 12 may result from the charge of the ions themselves and/or from bombardment of the substrate and thin-film material with the ions. In the absence of the discharge paths 10, the applicant finds that the charging of the pattern 12 may be so severe as to blow away parts of the tracks 7 and 9 over part of their length, as well as sometimes causing dielectric breakdown of the gate insulator 13 between the films 11 and 12.

In accordance with the present invention, each of the implantation discharge paths is formed as a series of extra thin-film regions 10 which are interleaved with the parallel tracks 9 in FIG. 3 (or with the tracks 7 of FIG. 1, not shown in FIG. 3). Each of the thin-film regions 10 is separated from the neighbouring tracks 9 (or 7) by a discharge gap 20 across which there occurs during the ion implantation step a leakage of charge resulting from the bombardment and implantation of the ions. FIG. 3 illustrates a first series, a second series, a third series and a fourth series of such extra regions 10 which provide four discharge paths at different locations along the longitudinal direction of the tracks 9 between the shift register stage 4 and the output driver stage 5. The regions of each series are separated from the regions of the neighbouring series by a space which is longer than the discharge gap. The implantation charge is thus dissipated in a direction transverse to the longitudinal direction of the tracks 9 and hence away from the thin-film transistors 15 of the drive circuit 4, 5.

As illustrated in FIG. 3, the outermost regions of these four discharge paths 10 may be integrally connected with a bus-bar region 21 at the periphery of the substrate 1, and during the implantation this bus-bar region 21 may be connected to a suitable discharge potential V (for example an earthing point in the implantation machine). The gap 22 between this bus-bar region 21 and the first path regions 10 may be larger than the gap 20 between regions 10 further within the active device area.

Figure 4:
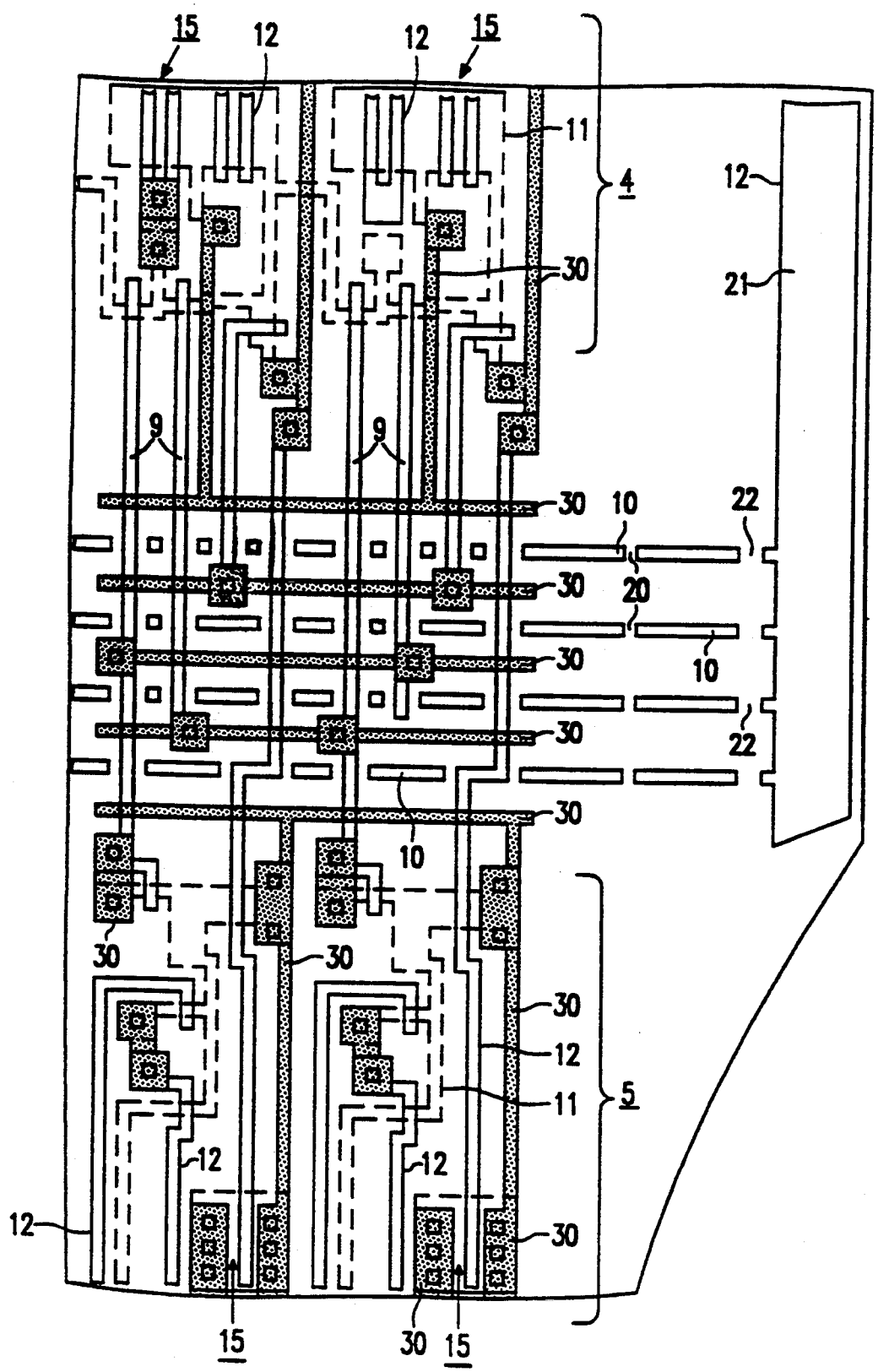
FIG. 4 is a plan view of the circuit pattern part of FIG. 3 at a later stage in the manufacture of the device.

FIG. 4 illustrates the circuit pattern of FIG. 3 at a later stage of manufacture, and the circuit pattern of FIG. 4 may be that of the manufactured device as sold to customers. As illustrated in FIG. 4 a further thin-film track pattern 30 (shown shaded in FIG. 4, for clarity in the drawing) has been formed by deposition and etching. The further track pattern 30 may be of a metal, for example aluminium, and may provide the column conductors 8, connection tracks for transistors 15 of the output driver stage 5 and connection tracks for the shift register stage 4 (including possible selection transistors 15 of the parallel outputs of the shift register itself). As shown in FIG. 4, some of the tracks of the pattern 30 which extend transverse to the tracks 9 may be accommodated in the spaces between the different series of discharge path regions 10. The track pattern 30 is insulated from the underlying patterns 11 and 12 over most of the area by an intermediate insulating layer, except where contact windows are present in this insulating layer. These contact windows are illustrated in FIG. 4 by squares or rectangles of solid outline inside the solid outline of the track pattern 30.

Because the discharge regions 10 are separated from the tracks 9 by a discharge gap 20, these regions 10 and tracks 9 can be formed from the same thin-film pattern 12, using the same etching step as is used to form the pattern 12. The gaps 20 are sufficiently small in width (between the region 10 and the track region 9) that discharge of the implantation charge occurs by normal leakage between the regions 9 and 10. In the case of a thin-film technology having layout rules with a minimum permissible spacing of 5 $\mu$m (micrometers), the width of the gap may be 5 $\mu$m. In a specific embodiment of FIGS. 3 and 4, the tracks 9 and discharge paths 10 may have the following dimensions, for example: the tracks 9 may be 6 $\mu$m wide with a pitch of 46 $\mu$m, the regions 10 interleaved between these tracks may be 30 $\mu$m wide with a discharge gap 20 of 5 $\mu$m between a region 10 and the neighbouring track 9. The space between the neighbouring series of paths 10 may be the minimum necessary to accommodate tracks 30 between the neighbouring series without the tracks 30 overlapping the regions 10; thus, in this area the regions 10 may be for example 8 $\mu$m long (in a direction parallel to the longitudinal direction of the neighbouring tracks 9) in the specific embodiment now being described. The regions 10 in other areas may be longer, although it can be advantageous for yield reasons to divide a long region 10 into a series of shorter regions 10 in the direction parallel to the longitudinal direction of the neighbouring tracks 9.

Figure 5:
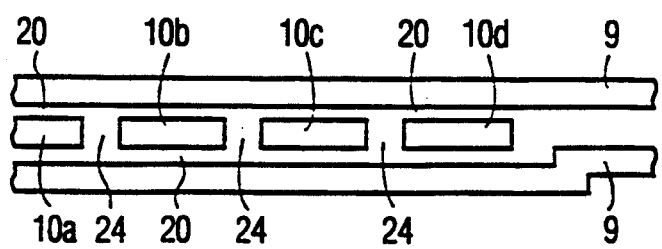
FIG. 5 is a plan view of part of another thin-film pattern at an ion implantation stage.

FIG. 5 illustrates the division of a region 10 into a series of short regions 10a, 10b, 10c, 10d in the direction parallel to the longitudinal direction of the tracks 9. Discharge gaps 24 are present between the regions 10a to 10d, as well as discharge gaps 20 between these individual regions and the tracks 9. When the gaps 20 are small (for example, the minimum spacing permitted by the layout rules), short circuits may occur occasionally between the regions 10 and the tracks 9, as a result of the manufacturing process. If the regions 10 are long then the probability of such short-circuits occuring on both sides of the same region 10 is increased, and such an occurance would short-circuit the neighbouring tracks 9 so reducing the yield of good devices. However, by providing the regions 10 as a series of short regions 10a to 10d, the likelihood of both sides of one such short region 10a, 10b, 10c or 10d being short-circuited is greatly reduced. The configuration of FIG. 5 may be used for regions 10 of a discharge path extending transverse to the tracks 9 as in FIGS. 3 and 4. However, the configuration of FIG. 5 may be used in other device areas to provide a discharge path 10 which extends between and parallel to the longitudinal direction of neighbouring tracks 9; and in a specific example of an embodiment of such a path the gaps 20 may be 5 $\mu$m wide between a track 9 and a region 10a, 10b, 10c, 10d which is itself 5 $\mu$m wide, so accommodating the region structure 10a, 10b, 10c, 10d in a space of 15 $\mu$m between the neighbouring tracks 9.

FIGS. 3 and 4 illustrate the provision of discharge paths 10 in accordance with the invention between stages 4 and 5 of the row driver circuitry of FIG. 1. Similar discharge paths 10 in accordance with the invention may be interleaved with the row conductors 7 of the matrix 2,3 as illustrated in FIG. 1. Discharge path regions 10 with discharge gaps 20 and/or 24 in accordance with the invention may also be formed from the film 11, being interleaved between circuit element regions of the film pattern 11. Furthermore, discharge paths 10 in accordance with the invention may be provided in the thin-film pattern of the column drive circuitry 6.

From reading the present disclosure, other variations and modifications will be apparent to persons skilled in the art. Such variations and modifications may involve equivalents and other features which are already known in the design, manufacture and use of thin-film electronic devices and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicity or implicity or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing an electronic device having an insulating substrate on which thin-film circuit elements are formed by steps which include depositing films of various materials on the substrate, etching the films into a desired pattern, and implanting ions in areas of at least one of the films, wherein before the implantation step there is provided on the substrate a thin-film pattern which comprises a group of tracks and a discharge path, which discharge path extends from within the group outwards towards a periphery of the substrate and serves to mitigate charging of the tracks during the ion implantation, which method is characterised in that the thin-film pattern provides along the length of the discharge path a series of discharge gaps which separate successive thin-film regions of the path and across which, during the ion implantation step, charge leakage occurs between the separate successive regions of the path, the tracks of the group being separated by respective discharge gaps from adjacent regions of the path.

2. A method as claimed in claim 1, further characterised in that the discharge path comprises a series of thin-film regions which extends in a direction transverse to the longitudinal direction of the tracks, and the individual regions of the series are interleaved with the parallel tracks of the group.

3. A method as claimed in claim 2, further characterised in that there are formed at least a first series and a second series of the regions to provide respective first and second discharge paths at different locations along the longitudinal direction of the tracks, the regions of the first series being separated from the regions of the second series by a space which is longer than the discharge gap.

4. A method as claimed in claim 3, further characterised in that, after the ion implantation step, a further thin-film track which extends transverse to the group of tracks is provided in the space between the first and second series.

5. A method as claimed in claim 1, further characterised in that the pattern of thin-film circuit elements formed on the substrate comprises both a matrix of switching elements and a drive circuit for driving parallel lines of the matrix, in that the thin-film parallel tracks form part of the drive circuit for the parallel lines, and in that the discharge path extends in a direction away from the circuit elements of the matrix and from the circuit elements of the drive circuit.

6. A method as claimed in claim 1, further characterised in that an outermost thin-film region of the discharge path extends to a peripheral area of the substrate.

7. A method as claimed in claim 6, further characterised in that the outermost thin-film region at the peripheral area is connected to a discharge potential during the ion implantation step.

8. A method as claimed in claim 2, further characterized in that the pattern of thin-film circuit elements formed on the substrate comprises both a matrix of switching elements and a drive circuit for driving parallel lines of the matrix, in that the thin-film parallel tracks form part of the drive circuit for the parallel lines, and in that the discharge path extends in direction away from the circuit elements of the matrix and from the circuit elements of the drive circuit.

9. A method as claimed in claim 3, further characterized in that the pattern of thin-film circuit elements formed on the substrate comprises both a matrix of switching elements and a drive circuit for driving parallel lines of the matrix, in that the thin-film parallel tracks form part of the drive circuit for the parallel lines, and in that the discharge path extends in direction away from the circuit elements of the matrix and from the circuit elements of the drive circuit.

10. A method as claimed in claim 4, further characterized in that the pattern of thin-film circuit elements formed on the substrate comprises both a matrix of switching elements and a drive circuit for driving parallel lines of the matrix, in that the thin-film parallel tracks form part of the drive circuit for the parallel lines, and in that the discharge path extends in a direction away from the circuit elements of the matrix and from the circuit elements of the drive circuit.

11. A method as claimed in claim 2, further characterized in that an outermost thin-film region of the discharge path extends to a peripheral area of the substrate.

12. A method as claimed in claim 3, further characterized in that an outermost thin-film region of the discharge path extends to a peripheral area of the substrate.

13. A method as claimed in claim 4, further characterized in that an outermost thin-film region of the discharge path extends to a peripheral area of the substrate.

14. A method as claimed in claim 5, further characterized in that an outermost thin-film region of the discharge path extends to a peripheral area of the substrate.

* * * * *